United States Patent
Kim et al.

(10) Patent No.: US 7,833,875 B2
(45) Date of Patent: Nov. 16, 2010

(54) SEMICONDUCTOR DEVICE AND METHOD OF FABRICATING THE SAME

(75) Inventors: Jung-Hwan Kim, Seongnam-si (KR); Hun-Hyeoung Leam, Yongin-si (KR); Tae-Hyun Kim, Suwon-si (KR); Seok-Woo Nam, Yongin-si (KR); Hyun Namkoong, Anyang-si (KR); Yong-Seok Kim, Seoul (KR); Tea-Kwang Yu, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 235 days.

(21) Appl. No.: 11/931,571

(22) Filed: Oct. 31, 2007

(65) Prior Publication Data

US 2008/0057670 A1 Mar. 6, 2008

Related U.S. Application Data

(60) Continuation-in-part of application No. 11/149,396, filed on Jun. 9, 2005, now Pat. No. 7,342,280, which is a division of application No. 10/446,970, filed on May 28, 2003, now Pat. No. 6,913,969.

(30) Foreign Application Priority Data

Apr. 19, 2007 (KR) ...................... 10-2007-0038327

(51) Int. Cl.
*H01L 21/76* (2006.01)
(52) U.S. Cl. .................. 438/424; 438/296; 438/359
(58) Field of Classification Search ................ 438/296, 438/359, 391, 221, 244, 294
See application file for complete search history.

(56) References Cited

U.S. PATENT DOCUMENTS

| | | | |
|---|---|---|---|
| 6,323,107 B1 | 11/2001 | Ueda et al. | |
| 6,380,583 B1 | 4/2002 | Hsieh et al. | |
| 6,720,611 B2 | 4/2004 | Jang | |
| 6,825,544 B1 * | 11/2004 | Jin | 257/499 |
| 6,849,514 B2 | 2/2005 | Han | |
| 6,927,131 B2 | 8/2005 | Kim | |
| 7,172,938 B2 | 2/2007 | Choi et al. | |

(Continued)

FOREIGN PATENT DOCUMENTS

JP    4335578    11/1992

(Continued)

OTHER PUBLICATIONS

English Abstract for Publication No. 1020020088554.

(Continued)

*Primary Examiner*—Thao P. Le
(74) *Attorney, Agent, or Firm*—F. Chau & Associates, LLC (57) ABSTRACT

A semiconductor device includes an isolation layer defining an active region formed in a semiconductor substrate. A first recessing process is performed on the isolation layer to expose edge portions of the active region. A first rounding process is performed to round the edge portions of the active region. A second recessing process is performed on the isolation layer. A second rounding process is performed to round the edge portions of the active region.

18 Claims, 6 Drawing Sheets

U.S. PATENT DOCUMENTS

| | | | |
|---|---|---|---|
| 7,227,219 | B2 | 6/2007 | Mikolajick |
| 7,227,220 | B2 | 6/2007 | Kim et al. |
| 7,335,560 | B2 | 2/2008 | Kim |
| 7,408,806 | B2 | 8/2008 | Park et al. |
| 2002/0001916 | A1* | 1/2002 | Chen et al. .................. 438/424 |
| 2002/0162571 | A1* | 11/2002 | Su et al. ........................ 134/2 |
| 2002/0187616 | A1* | 12/2002 | Lai et al. .................... 438/425 |
| 2002/0197821 | A1* | 12/2002 | Liu ............................. 438/424 |
| 2003/0098492 | A1* | 5/2003 | Singh et al. ................. 257/510 |
| 2004/0072451 | A1* | 4/2004 | Choi .......................... 438/791 |
| 2005/0009290 | A1 | 1/2005 | Yan et al. |
| 2005/0012142 | A1 | 1/2005 | Hazama et al. |
| 2006/0038220 | A1 | 2/2006 | Kusters et al. |
| 2006/0141731 | A1* | 6/2006 | Kim .......................... 438/386 |
| 2006/0148197 | A1* | 7/2006 | Wu et al. .................... 438/424 |
| 2006/0220088 | A1 | 10/2006 | Ueno |
| 2007/0026632 | A1* | 2/2007 | Yamamoto .................. 438/424 |
| 2007/0042564 | A1* | 2/2007 | Yoon .......................... 438/424 |
| 2007/0148979 | A1* | 6/2007 | Lee et al. .................... 438/700 |
| 2007/0155128 | A1* | 7/2007 | Choi .......................... 438/424 |
| 2007/0238237 | A1 | 10/2007 | Lee et al. |
| 2007/0287260 | A1* | 12/2007 | Wu et al. .................... 438/400 |
| 2008/0171416 | A1 | 7/2008 | Fang et al. |
| 2009/0239352 | A1* | 9/2009 | Kitagawa et al. ............ 438/439 |

FOREIGN PATENT DOCUMENTS

| | | |
|---|---|---|
| JP | 10-022403 | 1/1998 |
| JP | 2000-306991 | 11/2000 |
| JP | 2001-358237 | 12/2001 |
| JP | 2002-100686 | 4/2002 |
| JP | 2003-068894 | 3/2003 |
| JP | 2005-079165 | 3/2005 |
| JP | 2006-013335 | 1/2006 |
| KR | 1020020088554 | 11/2002 |
| KR | 1020020096741 | 12/2002 |
| KR | 1020030055793 | 7/2003 |
| KR | 1020060000481 | 1/2006 |
| KR | 1020060131213 | 12/2006 |

OTHER PUBLICATIONS

English Abstract for Publication No. 1020030055793.
English Abstract for Publication No. 1020060000481.
Foreign Office Action.
English Abstract for Publication No. 1020060131213.
English Abstract for Publication No. 2006-013335.
English Abstract for Publication No. JP4335578.
English Abstract for Publication No. 10-022403.
English Abstract for Publication No. 2000-306991.
English Abstract for Publication No. 2001-358237.
English Abstract for Publication No. 2002-100686.
English Abstract for Publication No. 2003-068894.

* cited by examiner

SEMICONDUCTOR DEVICE AND METHOD OF FABRICATING THE SAME

CROSS-REFERENCE TO RELATED PATENT APPLICATIONS

This is a continuation-in-part application of U.S. application Ser. No. 11/149,396 filed Jun. 9, 2005 now U.S. Pat. No. 7,342,280 which is a divisional of U.S. application Ser. No. 10/446,970 filed on May 28, 2003 now U.S. Pat. No. 6,913,969, the disclosures of which are herein incorporated by reference in their entirety.

This application also claims the benefit of Korean Patent Application No. 10-2007-0038327, filed on Apr. 19, 2007, in the Korean Intellectual Property Office, the disclosure of which is herein incorporated by reference in its entirety.

BACKGROUND OF THE INVENTION

1. Field of the Invention

The present invention relates to a semiconductor device and a method of fabricating the same.

2. Description of Related Art

As semiconductor device integration increases, a size of an active region on which a channel is formed is reduced. Semiconductor devices having small active regions may exhibit high leakage currents and low driving performances. For example, when a channel length is reduced, a short channel effect can occur, and when a channel width is reduced, a driving current can be decreased.

Accordingly, there is a need to increase a channel area in highly integrated semiconductor devices. For example, the active region can have a larger surface area by forming a protrusion in the active region with respect to an isolation layer. In the active region, sidewalls as well as an upper surface can be used as a channel, and thus, the driving performance of the semiconductor device can be increased.

When the sidewalls of an active region are used as a channel, an electric field can be enhanced in an edge portion of the active region. The electric field increases as the curvature radius of the edge portion of the active region decreases. A threshold voltage of a semiconductor device can be changed according to the profile of the edge portion of the active region, and the threshold voltages between semiconductor devices respectively fabricated using a single wafer or a single batch have a wide distribution range. The wide distribution range of the threshold voltages decreases the reliability of the semiconductor device.

Furthermore, the profile of the edge portion of the active region can affect the programming characteristics of a non-volatile memory device. When the electric field is enhanced in the edge portion of the active region, more tunneling effects of electrons or holes may occur in the edge portion of the active region. As a result, a tunneling insulating layer disposed on the edge portion of the active region deteriorates, and the non-volatile memory device has low durability and low high-temperature reliability.

SUMMARY OF THE INVENTION

According to an embodiment of the present invention, an isolation layer may be recessed from the surface of a semiconductor substrate. An active region may be defined in the semiconductor substrate by the isolation layer, the active region protruding upward with respect to the isolation layer. A curvature radius of edge portions of the active region may be in the range from about ⅓ to about ½ of the width of an upper portion of the active region.

According to another embodiment of the present invention, a method of fabricating a semiconductor device includes forming an isolation layer defining an active region in a semiconductor substrate. A plurality of recessing processes may be performed on the isolation layer to expose edge portions of the active region. A plurality of rounding processes may be performed to round the edge portions of the active region.

The rounding processes and the recessing processes may be performed alternately.

According to another embodiment of the present invention, at least one rounding process from among a plurality of rounding processes may include etching edge portions of the active region.

According to another embodiment of the present invention, at least one rounding process from among a plurality of rounding processes may include oxidizing edge portions of the active region.

According to another embodiment of the present invention, a method of fabricating a semiconductor device includes forming an isolation layer defining an active region in a semiconductor substrate. A first recessing process may be performed on the isolation layer to expose edge portions of the active region. A first rounding process may be performed to round the edge portions of the active region. A second recessing process may be performed on the isolation layer. A second rounding process may be performed to round the edge portions of the active region.

BRIEF DESCRIPTION OF THE DRAWINGS

The present invention will become more apparent by describing in detail exemplary embodiments thereof with reference to the attached drawings in which.

DETAILED DESCRIPTION OF PREFERRED EMBODIMENTS

The present invention will now be described more fully with reference to the accompanying drawings, in which exemplary embodiments of the invention are shown. The invention may, however, be embodied in many different forms and should not be construed as being limited to embodiments set forth herein; rather, embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

A semiconductor device according to embodiments of the present invention may include memory devices and/or logic devices.

Figure 1:
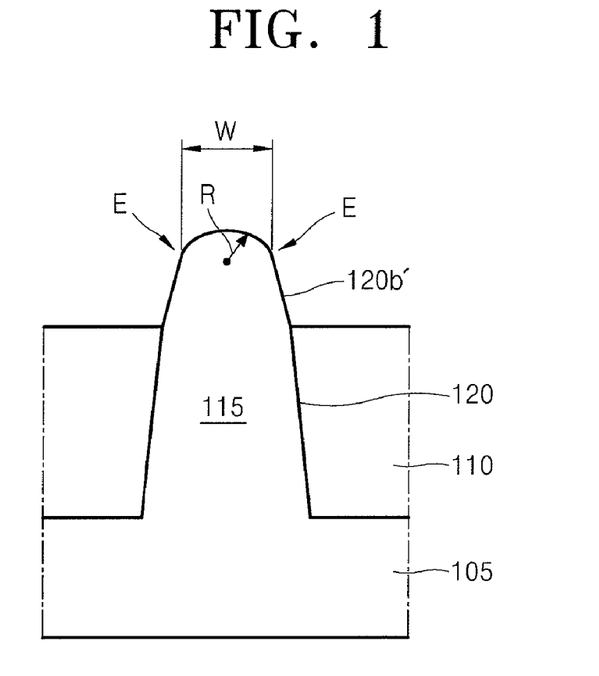
FIG. 1 is a sectional view of a semiconductor device according to an embodiment of the present invention.

FIG. 1 is a sectional view of a semiconductor device according to an embodiment of the present invention.

Referring to FIG. 1, an active region 115 may be defined in a semiconductor substrate 105 by an isolation layer 110. The semiconductor substrate 105 includes, for example, silicon (Si), germanium (Ge), or silicongermanium (SiGe). The active region 115 may be used to form an active device such as a transistor or a capacitor. The isolation layer 110 may electrically isolate the active device. The isolation layer 110 may include an insulating layer, for example, an oxide layer or nitride layer.

The isolation layer 110 is, for example, a shallow trench isolation (STI) layer. The isolation layer 110 may be formed by filling a trench extending to an inner portion of the semiconductor substrate 105. The isolation layer 110 may be recessed from a surface of the semiconductor substrate 105 to a predetermined depth. As a result, edge portions E of the active region 115 may be exposed by the isolation layer 110. The isolation layer 110 may be recessed to expose a part 120b' of sidewalls 120 of the active region 115.

The surface of the active region 115 exposed by the isolation layer 110 may be used as a channel that is a conductive passage for charges. A gate electrode (not shown) may cover the exposed surface of the active region 115. The active region 115 protruding with respect to the isolation layer 110 may have a different structure from a planar-type structure, that is, a fin-type structure. Accordingly, the structure of the active region 115 may provide a greater driving current than the planar structure, and thus, the driving performance of a semiconductor device may be improved.

The edge portions E of the active region 115 may be rounded. Such a rounded shape may substantially prevent enhancement of an electric field generated from the gate electrode at the edge portions E of the active region 115. As a result, threshold voltage irregularity due to irregular electron fields at the edge portions E of the active region 115 can be decreased, and reliability of a semiconductor device can be improved.

For example, a curvature radius R of the edge portions E of the active region 115 may be in the range from about ⅓ to about ½ of the width W of an upper portion of the active region 115. When the curvature radius R is smaller than about ⅓ of the width W, an electric field enhancement decrease effect is small, and thus, threshold voltages may be irregular. When the curvature radius R is about ½ of the width W, the upper portion of the active region 115 is rounded and has a curvature radius, and a high electric field enhancement decrease effect can be obtained. When the curvature radius R is greater than about ½ of the width W, the upper portion of the active region 115 may have a sharp pointed part, and thus, an electric field enhancement may occur.

When the semiconductor device according to an embodiment of the present invention is a non-volatile memory device, an electric field enhancement decrease at the edge portions E of the active region 115 may contribute to high reliability of a tunneling insulating layer (not shown) of the non-volatile memory device, where a local electric field enhancement may cause tunneling of charges in a portion of the tunneling insulating layer on the active region 115. In addition, the active region 115 has a larger surface area and a charge storage layer formed on the active region 115 may also have a larger area. For the active region 115 having a larger surface area, the charge storage layer may store more charges, and reliability of multi-bit operation using a local charge trap can be improved.

FIGS. 2 through 6 are sectional views illustrating a method of fabricating a semiconductor device according to an embodiment of the present invention.

Figure 2:
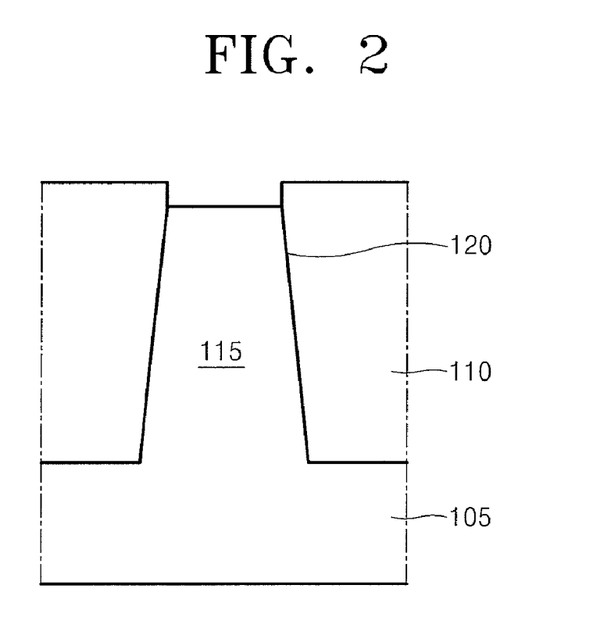
FIGS. 2 through 6 are sectional views illustrating a method of fabricating a semiconductor device according to an embodiment of the present invention.

Referring to FIG. 2, an isolation layer 110 may be formed on a semiconductor substrate 105 to define an active region 115. For example, a trench (not shown) is formed in the semiconductor substrate 105, and filled with an insulating layer. For example, the insulating layer may include an oxide layer or a nitride layer. The insulating layer may be planarized using an etch-back method or a chemical mechanical polishing (CMP) method. The planarizing process can be performed using a protective layer (not shown) disposed on the active region 115 as a stop point, e.g., an etch stop. At this time, the isolation layer 110 may surround the sidewalls 120 of the active region 115 and may protrude from the surface of the semiconductor substrate 105 to a predetermined height.

Figure 3:
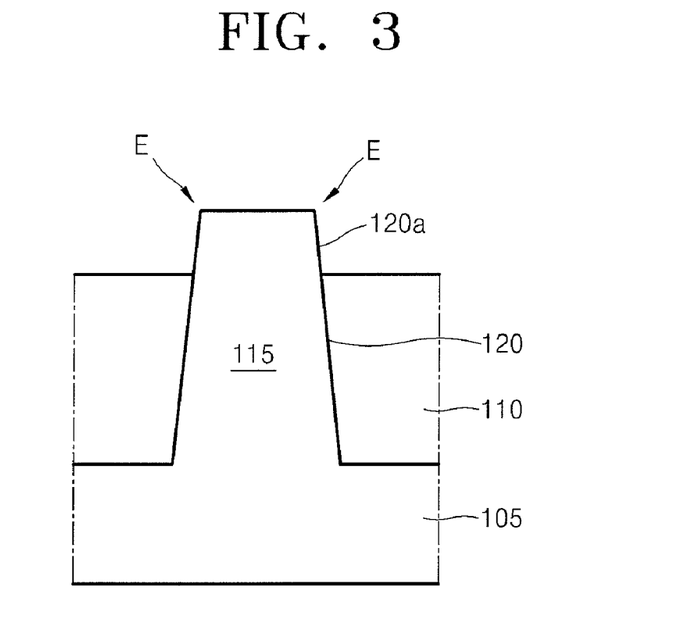

Referring to FIG. 3, a first recessing process is performed to recess the isolation layer 110 so that edge portions E of the active region 115 are exposed by the isolation layer 110. For example, the isolation layer 110 can be recessed to expose a first portion 120a of the sidewalls 120. The height of the first portion 120a can be adjusted according to a number of rounding processes and a rounding efficiency.

For example, the first recessing process of the isolation layer 110 can be performed using a wet etching method or a dry etching method. When the isolation layer 110 is an oxide layer, the wet etching may be performed using a HF solution.

Figure 4:
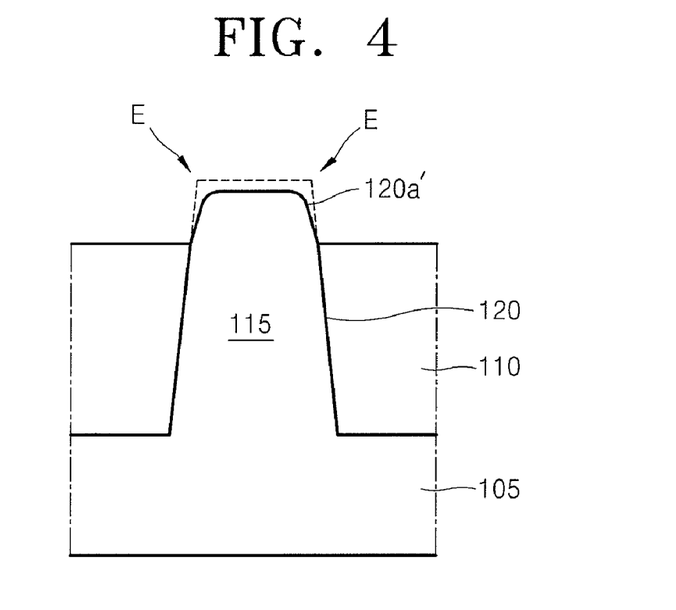

Referring to FIG. 4, a first rounding process is preformed to round the edge portions E of the active region 115. For example, the first rounding process may be performed by partially etch the active region 115. The edge portions E of the active region 115 can be rounded since the edge portions E of the active region 115 having a wide surface area are more quickly etched than other portions of the active region 115. The width of a first portion 120a' may be smaller than the width of a first portion 120a (see FIG. 3) due to the first rounding process.

For example, the active region 115 can be isotropically and/or anisotropically etched. The isotropic etching may be performed using a wet etching method or a chemical dry etching (CDE) method. For example, the wet etching method may use a mixture (SC1) solution of $NH_4OH$, $H_2O_2$, and $H_2O$. The anisotropic etching can be performed using a plasma dry etching method. The rounding process can be performed using the anisotropic etching according to the shape of the active region 115 and the concentration of radicals in plasma.

Figure 5:
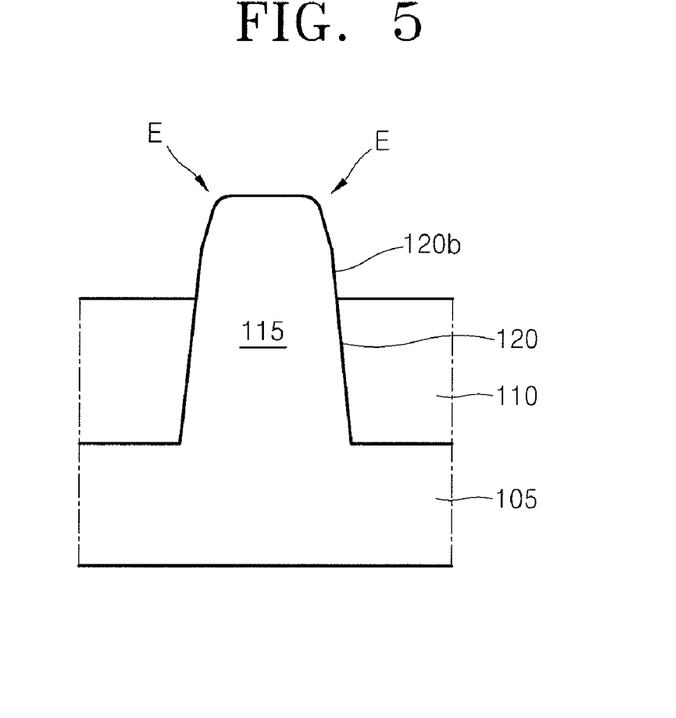

Referring to FIG. 5, a second recessing process is performed on the isolation layer 110. For example, the isolation layer 110 can be recessed to expose a second portion 120b of the sidewalls 120 of the active region 115. The height of the second portion 120b may be larger than the height of the first portion 120a. The second recessing process may be performed on the isolation layer 110 using, for example, a wet etching method or a dry etching method.

Figure 6:
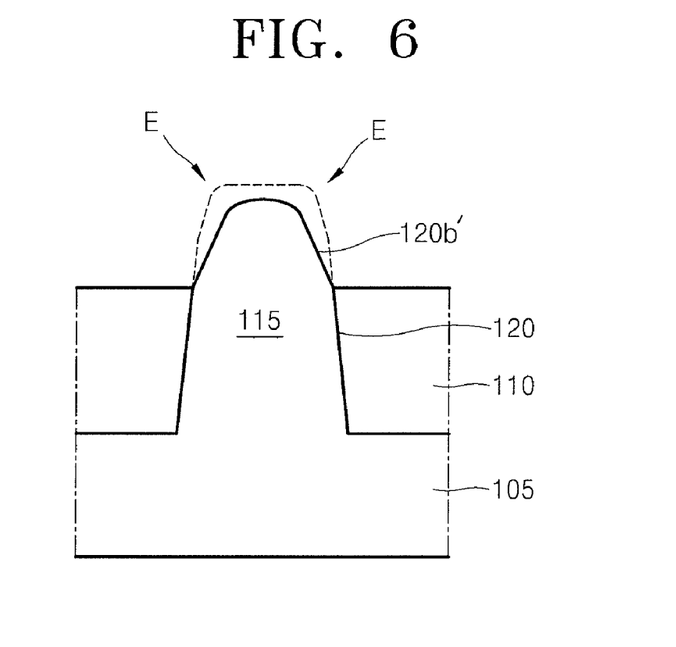

Referring to FIG. 6, a second rounding process is performed to round the edge portions E of the active region 115. For example, the second rounding process can be performed by partially etching the active region 115. The edge portions E of the active region 115 can be rounded since the edge portions E of the active region 115 having a wide surface area are more quickly etched than other portions of the active region 115. The width of a second portion 120b' may be smaller than the width of the first portion 120a' (see FIG. 4) due to the second rounding process. For example, the active region 115 can be isotropically and/or anisotropically etched, as described with reference to the first rounding process.

The isolation layer 110 is gradually recessed through the first and second rounding processes. The first portion 120a of the sidewalls 120 of the active region 115 is exposed, and then the second portion 120b of the sidewalls 120 of the active region 115 is exposed. Accordingly, the first portion 120a exposed through the first recessing process may be etched twice through first and second rounding processes, and a newly exposed portion of the sidewalls 120 of the active region 115 through the second recessing process may be etched once. As a result, the width of the active region 115 may be increased in a direction toward the isolation layer 110. Accordingly, in the rounding processes, a decrease in the surface area of the active region 115 due to a decrease in the width of the active region 115 can be substantially prevented.

Through the first and second rounding processes, the edge portions E can be sufficiently rounded. For example, a curvature radius R of the edge portions E of the active region 115 may be in the range from about ⅓ to about ½ of a width of an upper portion of the active region 115. Accordingly, through first and second recessing processes and first and second rounding processes, the edge portions E of the active region 115 are sufficiently rounded and a decrease in the width and surface area of the active region 115 can be substantially prevented.

Subsequently, a semiconductor device can be completely fabricated using a method of fabricating a semiconductor device known to those of ordinary skill in the art.

Figure 7:
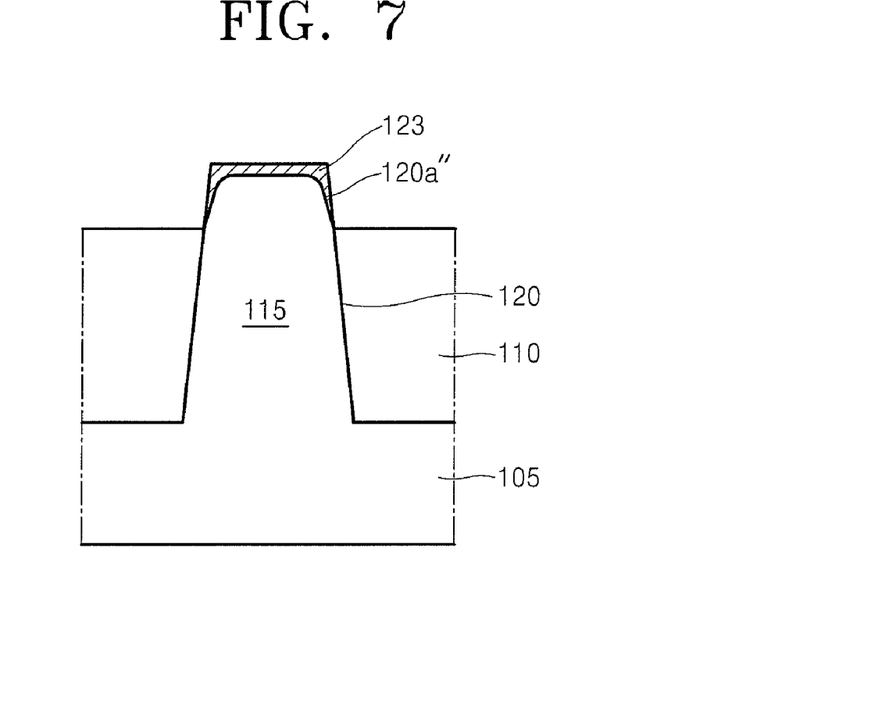
FIG. 7 is a sectional view illustrating a method of fabricating a semiconductor device according to another embodiment of the present invention.

FIG. 7 is a sectional view illustrating a method of a semiconductor device according to another embodiment of the present invention. The method of fabricating a semiconductor device is the same as the method according to the previous embodiment described with reference to FIGS. 2 through 6, except that the first rounding process is modified. FIG. 7 shows a sectional view of a semiconductor device fabricated by modifying the first rounding process described with reference to FIG. 4. The description of elements in the FIG. 7 similar to the elements in FIGS. 2 through 6 will not be repeated.

Referring to FIG. 7, a first rounding process is performed to oxidize a surface of the active region 115 exposed by the isolation layer 110 to form a sacrificial layer 123. The width of the first portion 120a'' of the sidewalls 120 may be smaller than the width of the edge portion 120a (see FIG. 3) due to the first rounding process. Portions of the sacrificial layer 123 formed in edge portions E of the active region 115 to which oxygen is supplied may be thick, and thus, the edge portions E of the active region 115 can be rounded by removal of the sacrificial layer 123.

Figure 8:
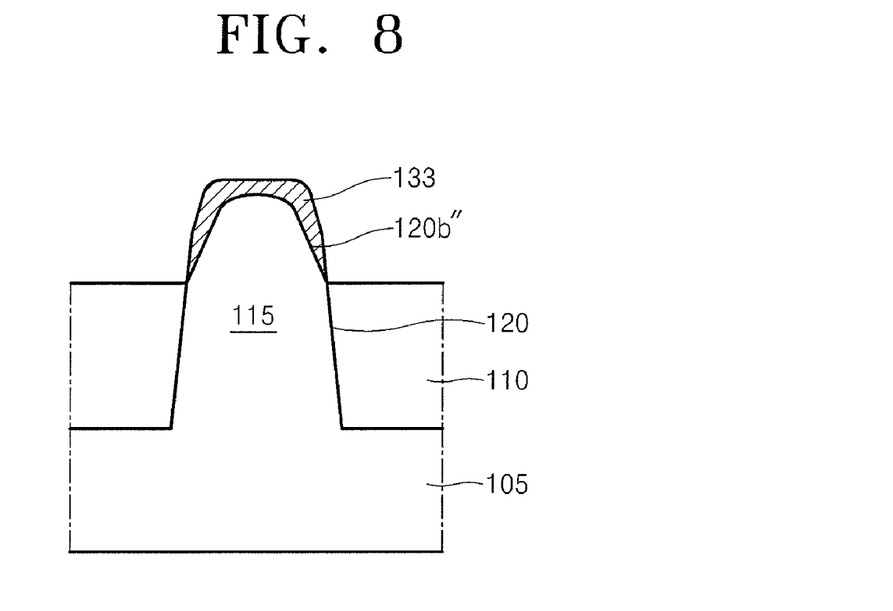
FIG. 8 is a sectional view illustrating a method of a semiconductor device according to another embodiment of the present invention.

FIG. 8 is a sectional view illustrating a method of a semiconductor device according to another embodiment of the present invention. The method of fabricating a semiconductor device is the same as the method described with reference to FIGS. 2 through 6, except that the second rounding process is modified. That is, FIG. 8 shows a sectional view of a semiconductor device fabricated by modifying the second rounding process described with reference to FIG. 6. Accordingly, the description of elements similar to the elements described with reference to FIGS. 2 through 6 will not be repeated.

Referring to FIG. 8, the second rounding process is performed to oxidize a surface of an active region 115 exposed by an isolation layer 110, thereby forming a sacrificial layer 133. As a result, the width of the second portion 120b'' of the sidewalls 120 may be smaller than the width of the first portion 120a' (see FIG. 4) of the sidewalls due to the second rounding process. Portions of the sacrificial layer 133 formed in edge portions E of the active region 115 to which oxygen is supplied may be thick, and thus, the edge portions E of the active region 115 can be rounded by removal of the sacrificial layer 133.

In the method of fabricating a semiconductor device described with reference to FIGS. 2 through 6, the first rounding process described with reference to FIG. 4 and the second rounding process described with reference to FIG. 6 may be modified to the first rounding process described with reference to FIG. 7 and the second rounding process described with reference to FIG. 8, respectively.

In previous embodiments of the present invention, two recessing processes and two rounding processes are performed. However, the number of the recessing and rounding processes are not limited thereto. For example, a plurality of recessing processes and a plurality of rounding processes can be performed alternately. A plurality of recessing processes may be understood with reference to the first and second recessing processes described above. A plurality of rounding processes may be understood with reference to the first and second rounding processes described above. The number of recessing and rounding processes may be limited in consideration of the manufacturing costs.

Figure 9:
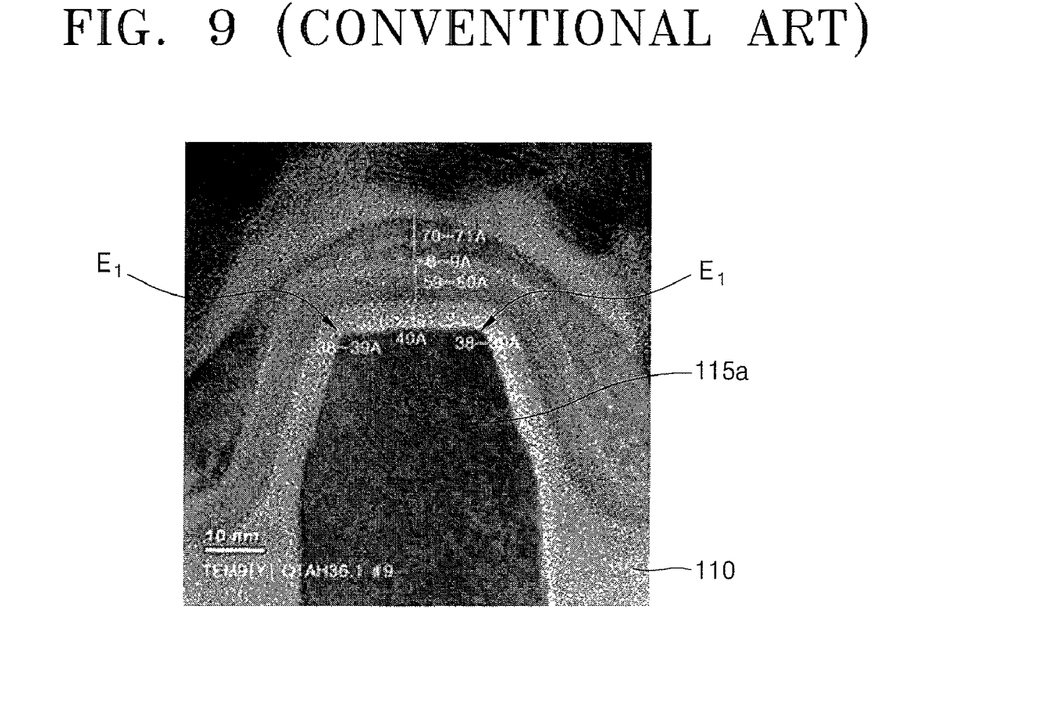
FIG. 9 is a transmission electron microscopic (TEM) image of a sectional view of a semiconductor device fabricated according to a comparative example of the present invention.
Figure 10:
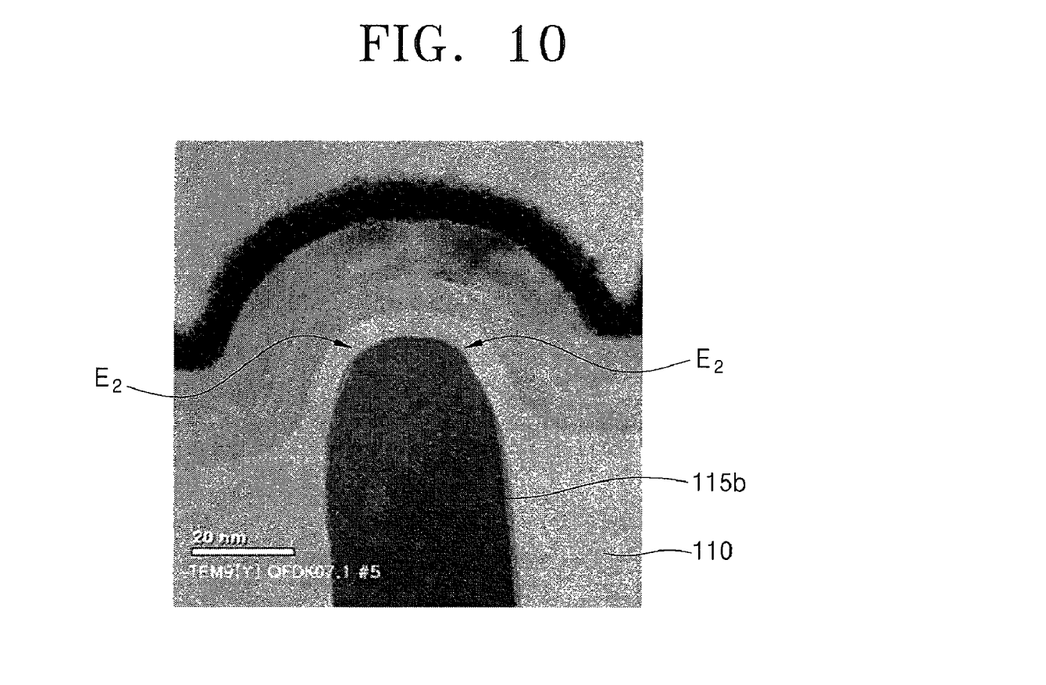
FIG. 10 is a TEM image of a sectional view of a semiconductor device fabricated according to an example of the present invention.

FIG. 9 is a transmission electron microscopic (TEM) image of a sectional view of a semiconductor device fabricated according to a comparative example of the present invention, and FIG. 10 is a TEM image of a sectional view of a semiconductor device fabricated according to an exemplary embodiment of the present invention. In forming the device depicted in FIG. 10, two rounding processes were performed to fabricate a semiconductor device; whereas, in the comparative example, only one rounding process was performed to fabricate a semiconductor device. In FIGS. 9 and 10, the semiconductor device was a NAND-type non-volatile memory device.

Referring to FIG. 9, in the comparative example, edge portions E1 of an active region 115a are not rounded. However, referring to FIG. 10, in the example, edge portions E2 of an active region 115b are rounded to have a curvature radius.

Figure 11:
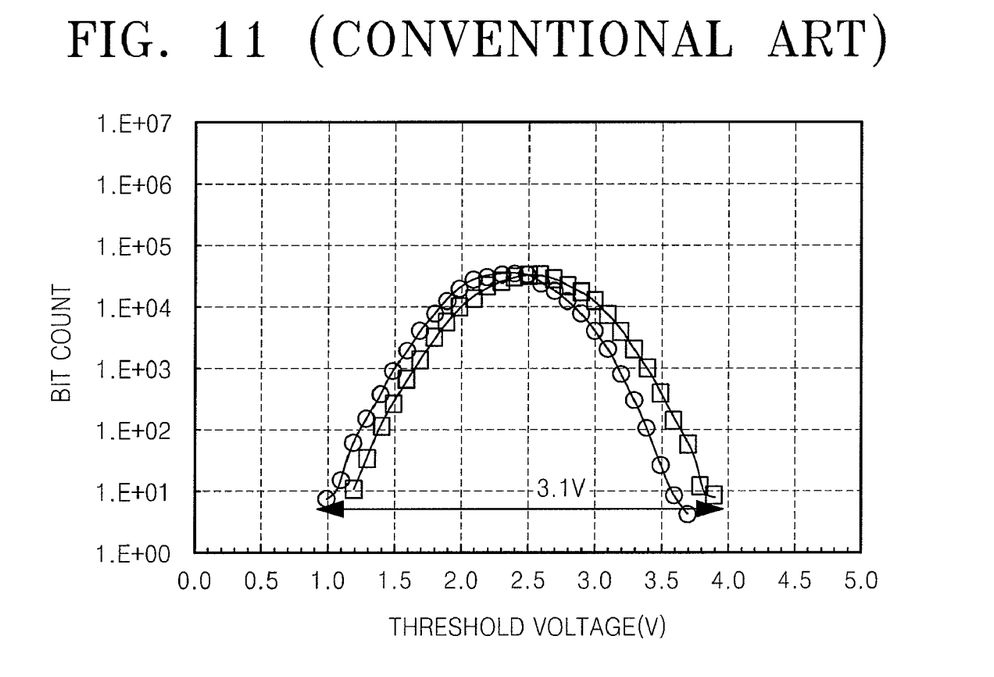
FIG. 11 is a graph illustrating the distribution of threshold voltages of a semiconductor device prepared according to the comparative example of the present invention.
Figure 12:
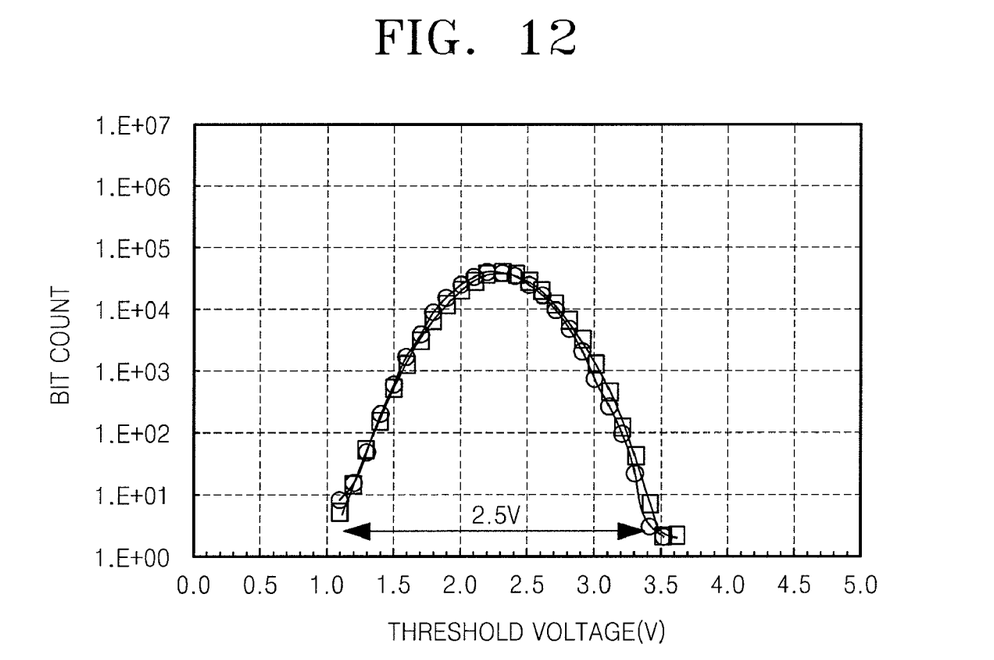
FIG. 12 is a graph illustrating the distribution of threshold voltages of a semiconductor device prepared according to an example of the present invention.

FIG. 11 is a graph illustrating the distribution of threshold voltages of a semiconductor device fabricated according to the comparative example of FIG. 9, and FIG. 12 is a graph illustrating the distribution of threshold voltages of a semiconductor device fabricated according to the example of FIG. 10. With respect to an NAND structure, the distribution of threshold voltages was obtained by measuring the threshold voltage of memory transistors except for two memory transistors located in both ends of the NAND structure.

Referring to FIG. 11, the memory device fabricated according to the comparative example has the threshold voltage distribution of about 3.1 V. Referring to FIG. 12, the memory device fabricated according to the example of FIG. 10 has the threshold voltage distribution of about 2.5. Accordingly, the memory device fabricated according to the example of FIG. 10 has narrower threshold voltage distribution than the memory device fabricated according to the comparative example of FIG. 9. Such an improvement on the threshold voltage distribution in the example of FIG. 10 may result from a uniform electric field distribution due to high rounding effects.

A semiconductor device according to embodiments the present invention has a high driving performance due to a large active region, and high reliability due to low electric field enhancement in edge portions of the active region.

A semiconductor device according to embodiments of the present invention can be a non-volatile memory device with a tunneling insulating layer having high durability and high-temperature reliability.

According to a method of fabricating a semiconductor device, the surface of an active region can be efficiently widened and high rounding effects can be obtained, by repeatedly using a recessing process and a rounding process.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A method of fabricating a semiconductor device, the method comprising:
    forming at least one trench in a semiconductor substrate;
    forming an isolation layer filled within the trench, the isolation layer defining an active region;
    performing a plurality of recessing processes on the isolation layer to expose edge portions of the active region; and
    performing a plurality of rounding processes to round the edge portions of the active region.

2. The method of claim 1, wherein each of the rounding processes and each of the recessing processes are repeated alternately.

3. The method of claim 1, wherein the recessing processes are performed using one of a wet etching method and a dry etching method.

4. The method of claim 1, wherein at least one rounding process from among the plurality of rounding processes comprises etching of the edge portions of the active region.

5. The method of claim 4, wherein the edge portions of the active region are one of isotropically etched and anisotropically etched.

6. The method of claim 5, wherein the isotropic etching is performed using one of a wet etching method and a chemical dry etching method.

7. The method of claim 5, wherein the anisotropic etching is performed using a plasma dry etching method.

8. The method of claim 1, wherein the performing of the rounding processes comprises oxidizing the edge portions of the active region.

9. The method of claim 8, wherein the performing of the rounding processes further comprises removing an oxidized portion of the active region.

10. The method of claim 1, wherein at least one rounding process of the plurality of rounding processes comprises etching the edge portions of the active region, and at least another rounding process of the plurality of rounding processes comprises oxidizing the edge portions of the active region.

11. The method of claim 1, wherein each of the recessing processes and each of the rounding processes are repeated alternately until a curvature radius of the edge portions of the active region is in the range from about ⅓ to about ½ of a width of an upper portion of the active region.

12. A method of fabricating a semiconductor device, the method comprising:
    forming at least one trench in a semiconductor substrate;
    forming an isolation layer filled within the trench, the isolation layer defining an active region;
    performing a first recessing process on the isolation layer to expose edge portions of the active region;
    performing a first rounding process to round the edge portions of the active region;
    performing a second recessing process on the isolation layer; and
    performing a second rounding process to round the edge portions of the active region.

13. The method of claim 12, wherein the first recessing process and the second recessing process are performed using one of a wet etching process and a dry etching process.

14. The method of claim 12, wherein the performing of the first rounding process and the second rounding process comprises etching the edge portions of the active region.

15. The method of claim 12, wherein the performing of the first rounding process and the second rounding process comprises oxidizing the edge portions of the active region.

16. The method of claim 12, wherein the performing of the first rounding process comprises etching the edge portions of the active region, and the performing of the second rounding process comprise oxidizing the edge portions of the active region.

17. A method of fabricating a semiconductor device, the method comprising:
    forming an isolation layer defining an active region in a semiconductor substrate;
    performing a first recessing process on the isolation layer such that an upper surface of the isolation layer is lower as much as a first difference than an upper surface of the active region;
    performing a first rounding process to round the edge portions of the active region;
    performing a second recessing process on the isolation layer such that an upper surface of the isolation layer is lower as much as a second difference than an upper surface of the active region; and
    performing a second rounding process to round the edge portions of the active region.

18. The method of claim 17, wherein the second difference is larger than the first difference.

* * * * *